(12) United States Patent
Elliott et al.

(10) Patent No.: US 7,091,602 B2
(45) Date of Patent: Aug. 15, 2006

(54) MINIATURE MOLDLOCKS FOR HEATSINK OR FLAG FOR AN OVERMOLDED PLASTIC PACKAGE

(75) Inventors: Alexander J. Elliott, Tempe, AZ (US); L. Mali Mahalingam, Scottsdale, AZ (US); William M. Strom, Chandler, AZ (US)

(73) Assignee: Freescale Semiconductor, Inc., Austin, TX (US)

( * ) Notice: Subject to any disclaimer, the term of this patent is extended or adjusted under 35 U.S.C. 154(b) by 445 days.

(21) Appl. No.: 10/318,699

(22) Filed: Dec. 13, 2002

(65) Prior Publication Data

US 2004/0113262 A1    Jun. 17, 2004

(51) Int. Cl.
*H01L 23/10* (2006.01)
*H01L 23/34* (2006.01)

(52) U.S. Cl. ........................ 257/706; 257/625
(58) Field of Classification Search ............. 257/625, 257/706
See application file for complete search history.

(56) References Cited

U.S. PATENT DOCUMENTS

| | | | | |
|---|---|---|---|---|
| 4,107,727 A | | 8/1978 | Ikezawa et al. | |
| 5,278,446 A | * | 1/1994 | Nagaraj et al. | 257/707 |
| 5,535,515 A | * | 7/1996 | Jacoby | 29/890.03 |
| 5,701,034 A | * | 12/1997 | Marrs | 257/706 |
| 5,722,161 A | | 3/1998 | Marrs | |
| 5,990,554 A | * | 11/1999 | Golubic et al. | 257/734 |
| 6,294,409 B1 | | 9/2001 | Hou | |

FOREIGN PATENT DOCUMENTS

| | | |
|---|---|---|
| EP | 0577966 A | 1/1994 |
| EP | 1202347 A2 | 5/2002 |
| JP | 07161896 | 6/1995 |

OTHER PUBLICATIONS

PCT/US03/30859 International Search Report.

* cited by examiner

*Primary Examiner*—Howard Weiss

(57) ABSTRACT

A system of mold locks (28, 30) is formed on a heatsink (2) of a packaged semiconductor to prevent/mitigate delamination. The mold locks (4, 12) anchor a plastic mold compound (34) that forms the protective cover for the packaged semiconductor die. The mold locks (4, 12) are miniaturized to allow the positioning of them within the flag portion of the heatsink (2) and leadframe (24) such that a semiconductor die can be anchored above the mold locks (4, 12) formed within the flag portion of the heatsink/lead frame (2, 24). The miniaturized size of the said moldlocks (4, 12 do not detract from the purpose of the die attach solder (36).

19 Claims, 6 Drawing Sheets

US 7,091,602 B2

MINIATURE MOLDLOCKS FOR HEATSINK OR FLAG FOR AN OVERMOLDED PLASTIC PACKAGE

FIELD OF THE INVENTION

The present invention relates to the field of semiconductor packaging, and more specifically to mold locks formed in a heatsink that anchor the semiconductor package mold compound to the heatsink.

BACKGROUND OF THE INVENTION

Microchips are formed from a variety of dissimilar materials. A semiconductor die, formed from silicon, gallium arsenide, germanium, or some other semiconductor material may be attached to the flag portion of a heatsink. Typically the heatsink is formed out of copper. The semiconductor die is bonded to the copper with a typical die bond soldering compound. The heatsink is attached to a lead frame made from a metal. The lead frame includes a series of lead contacts that serve as the output electrical contacts for the microchip. To electrically couple the semiconductor die to the lead frame, metal wires extend between the semiconductor die and the lead contacts. To protect the semiconductor die, wires, and lead contacts, a plastic mold compound encapsulates the semiconductor package.

During normal operation, the microchip will go through cycles of heating and cooling. These heating and cooling cycles cause the microchip to expand and contract. Since the microchip is made from dissimilar materials, the expansion and contraction rates within the microchip are not uniform. The different materials forming the microchip expand and contract at different rates. These differing rates of expansion and contraction within the microchip can lead to high internal stresses that can result in device failure. Primarily, the plastic mold compound expands at a sufficiently different rate such that it can separate from the metal heatsink and metal lead frame. This separation is referred to as delamination. When the plastic mold compound delaminates from the heatsink and lead frame, significant stresses are placed on the metal wires that couple the lead contacts to the semiconductor die. These stresses can become high enough such that it breaks the electrical contact between the wires coupling the lead contacts to the semiconductor die. Delamination can also cause microchip failure through moisture and oxidation. If the plastic mold compound delaminates in a manner such that a path from the outside world is created to the semiconductor die and wires, moisture can attack the wires and semiconductor die. Through corrosion, the moisture can cause the microchip to fail. It therefore becomes highly desirable to develop methods to preserve the integrity of the microchip and prevent delimination.

Chemical bonding is one method of adhering the plastic mold compound to the heatsink. The plastic mold compound is formed from an epoxy resin that has a composition that chemically bonds with the native oxide layer of the copper heatsink. While this chemical bonding does adhere the plastic mold compound to the heatsink, successive heating and cooling cycles can break these chemical bonds causing the plastic mold compound to separate from the heatsink.

Altering the chemical composition of the plastic mold compound to give it a rate of thermal expansion identical to the metal heatsink is another way of addressing the delamination problem. Minimizing the difference between the expansion and contraction rates of the metal microchip components and the plastic mold compound reduces the problem of delamination. If the metal components of the microchip and the plastic mold compound had identical rates of thermal expansion and contraction, the chemical bonds between the plastic mold compound and the metal heatsink would not experience mechanical stress from the thermal fluctuations. At this time, a reliable plastic compound with such properties remains unknown to the art.

Another method of addressing the problem of delamination is through locking and bonding the heatsink and plastic mold compound in such a manner that they mechanically interlock. The structures that interlock the plastic mold compound and the heatsink are commonly referred to as mold locks. Mold lock designs currently known to the art have a size and design that require their placement outside of the die attach area of the heatsink. Mold locks currently known to the art are usually formed in a trench-like moat design surrounding the flag portion of the heatsink. Placement of currently known mold locks in the flag portion of the heatsink leads to a variety of problems. If known moat-like mold locks are placed under the semiconductor die, the mold lock acts as a drain for the solder used to bond the semiconductor die to the heatsink. As a result, known mold locks degrade the bond between the semiconductor die and heatsink by draining the solder away. In addition, through draining solder away from the semiconductor die heatsink interface, known mold locks degrade the chemical bond between the plastic mold compound and heatsink when they are placed under the semiconductor die. As discussed above, the plastic mold compound has a composition such that it forms a chemical bond with the oxide layer of the copper heatsink. In contrast, the plastic mold compound does not form a chemical bond with the solder compound used to attach the semiconductor die. When existing mold locks drain solder away from under the semiconductor die heatsink interface, the area of the plastic mold compound heatsink interface is decreased and the area of the plastic mold compound solder interface is increased. Since a chemical bond is not formed between the solder and plastic mold compound, the overall bond between the plastic mold compound and the heatsink is degraded when known mold locks are formed under the semiconductor die. Still further, known mold locks adversely impact the bond line thickness.

The size of the semiconductor die varies depending upon the application for which the die is designed. At present, the semiconductor industry manufactures heatsinks and lead frames that have a size and design that match the size of each individual semiconductor die. Designing and manufacturing custom heatsinks and lead frames to match each size of semiconductor die is an expensive process. The semiconductor industry is constantly searching for methods to reduce the cost of manufacturing microchips. One method of reducing cost is through designing a "one size fits all" heatsink and lead frame structure that is compatible with a variety of semiconductor die sizes. In designing this "one size fits all" heatsink and lead frame structure, it is highly desirable to develop a mold lock structure that preserves microchip package integrity when used in conjunction with both large and small semiconductor die sizes in order to reduce cost and design time.

Designing a "one size fits all" heatsink structure presents a variety of challenges for mold lock design and microchip integrity. To view these design challenges, examine the integration of a large semiconductor die and a small semiconductor die with the same heatsink structure. When integrating the large semiconductor die with the heatsink, the plastic mold compound will see the mold locks formed on the exterior edge of the heatsink outside the die attach area and the semidconductor die itself lying in the flag area. However, when a small semiconductor die is placed on the same heatsink, a large bare area of the die attach area is exposed to the plastic mold compound. This large area of the flag has no mold locks to secure the plastic mold compound due to the difficulties known to the art discussed above. Consequently, the semiconductor package having the small semiconductor die and "one size fits all" heatsink" is now at risk for delamination. It is therefore highly desirable to develop a mold lock structure that is useable in the flag portion of the heatsink that addresses the problems known to the art. In this manner, it is possible to develop a "one size fits all" heatsink structure that preserves the package integrity of the microchip.

DETAILED DESCRIPTION OF A PREFERRED EMBODIMENT

Figure 1:
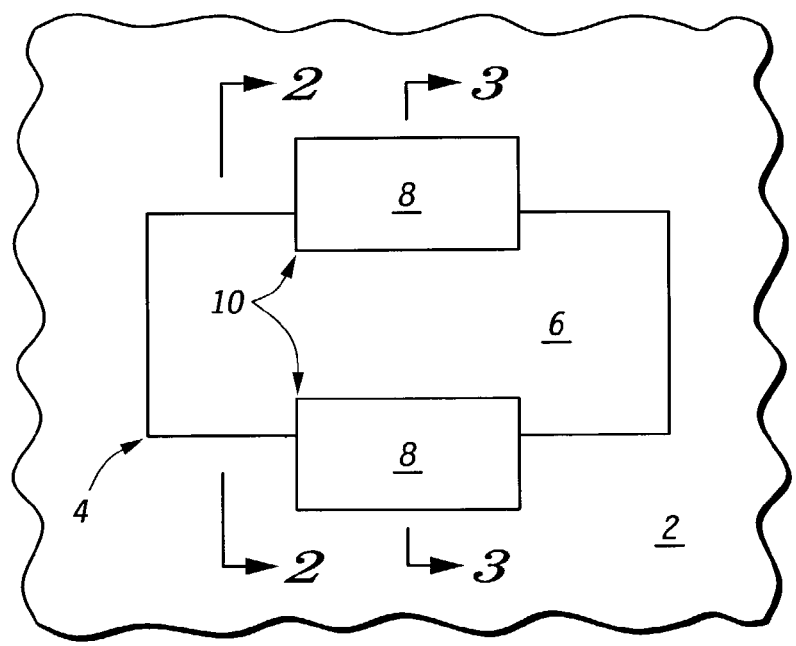
FIG. 1 illustrates a top view of a preferred embodiment of the present invention.

Referring to the figures by characters of reference, FIG. 1 illustrates a top view of a preferred embodiment of the present invention. A top surface of a heatsink 2 is illustrated having a mold lock 4 formed in therein. Mold lock 4 includes a primary channel 6 and a secondary channel 8. Both primary channel 6 and secondary channel 8 are formed in heatsink 2 through conventional metal stamping processes. Alternatively, an etching process could produce channels 6 and 8. Together, primary channel 6 and secondary channel 8 function to mechanically lock heatsink 2 to the plastic mold compound placed on the top surface of heatsink 2. Dovetail profiles 10 are formed by the creation of secondary channel 8. Dovetail profiles 10 acquired their name due to their visual similarity to joints used in wooden furniture making that are referred to as dovetail. In FIG. 1, dovetail profiles 10 are a full dovetail profile in that there is a dovetail profile 10 that extends from each side of primary channel 6.

Figure 2:
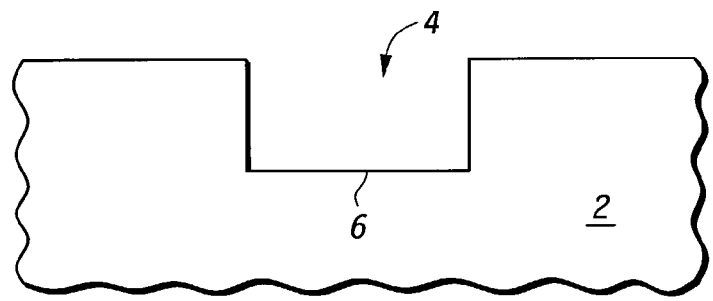
FIG. 2 illustrates a sectional view of a preferred embodiment of the present invention along section 2—2 of FIG. 1.

FIG. 2 illustrates a sectional view of a preferred embodiment of the present invention along section 2—2 of FIG. 1. Heatsink 2 is illustrated having primary channel 6 formed therein. Dovetail profiles 10 extend from either side of primary channel 6. Dovetail profiles 10 are formed from the fabrication of secondary channel 8. Together, primary channel 6, secondary channel 8, and dovetail profiles 10 form mold lock 4.

Figure 3:
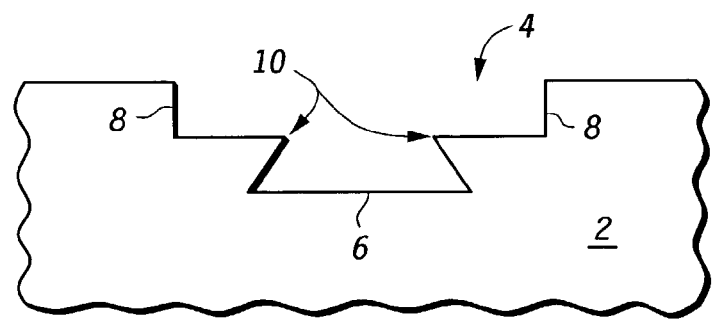
FIG. 3 illustrates a sectional view of a preferred embodiment of the present invention along section 3—3 of FIG. 1.

FIG. 3 illustrates a sectional view of a preferred embodiment of the present invention along section 3—3 of FIG. 1. Dovetail profiles 10 are illustrated protruding from the walls of primary channel 6. Both primary and secondary channels 6 and 8 are formed from a conventional metal stamping process, with primary channel 6 being stamped first so that upon stamping secondary channels 8, dovetails 10 are formed. Dovetail profiles 10 are the structure that forms the mechanical lock with the plastic mold compound that forms a protective cover over heatsink 2. Mold lock 4 has very small dimensions. As an example, one embodiment has secondary channel 8 depth of 0.003 inches, which is 0.0000762 meters. An exemplary depth of primary channel 6 is 0.006 inches, which is 0.0001524. Other depths and profiles for secondary channel 8 and primary channel 6 are used depending upon the desired application.

Figure 4:
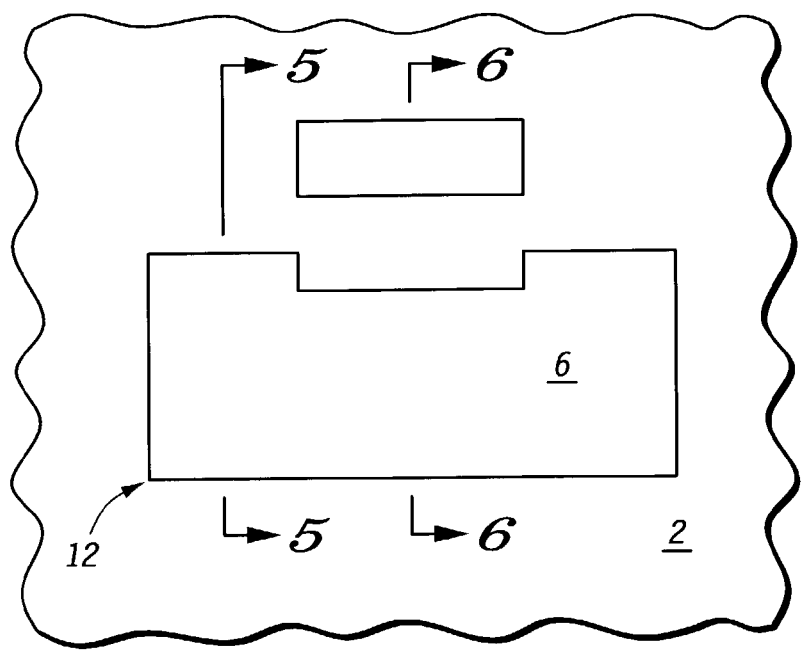
FIG. 4 illustrates a top view of an alternative embodiment of the present invention.
Figure 5:
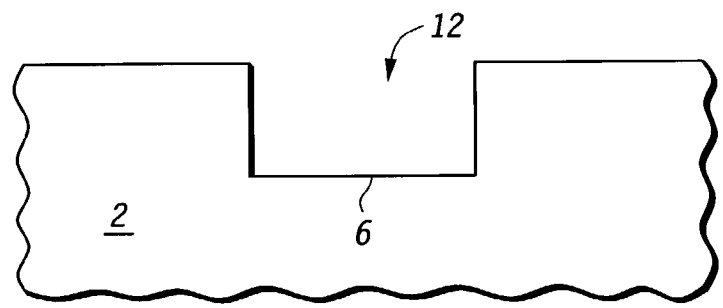
FIG. 5 illustrates a sectional view of an alternative embodiment of the present invention along section 5—5 of FIG. 4.
Figure 6:
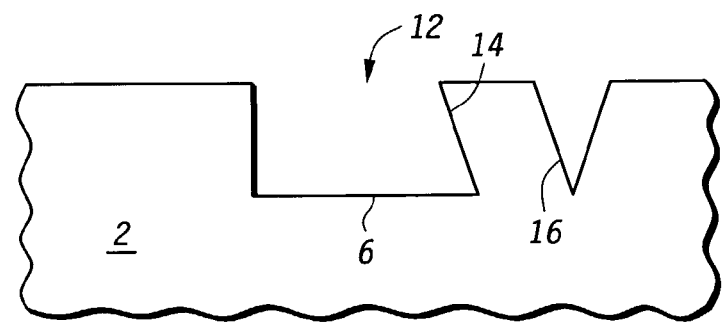
FIG. 6 illustrates a sectional view of an alternative embodiment of the present invention along section 6—6 of FIG. 4.

FIG. 4 illustrates a top view of an alternative embodiment of the present invention. The top surface of heatsink 2 is illustrated as having a half-dovetail profiles mold lock 12. Half-dovetail profiles mold lock 12 includes a primary channel 6 and a half-dovetail profile 14. Half dovetail profile 14 is produced from the formation of depression 16. FIG. 5 illustrates a sectional view of an alternative embodiment of the present invention along section 5—5 of FIG. 4. FIG. 6 illustrates a sectional view of an alternative embodiment of the present invention along section 6—6 of FIG. 4. Referring to FIGS. 5 and 6, primary channel 6 is formed in heatsink 2. Half dovetail profile 14 extends into primary channel 6. Half dovetail profile 14 is the structure that forms the mechanical lock with the plastic mold compound that forms the protective cover over heatsink 2. Half dovetail profile 14 is created by the formation of depression 16. Mold lock 12 has very small dimensions including, as an example, a depth for the primary channel 6 of 0.006 inches, which is 0.0001524 meters. Other depths for primary channel 6 are used depending upon the application. This small geometry of mold lock 12 avoids any problems associated with attaching a semiconductor die to heatsink 2 while achieving the desired effect of reducing the delamination between the plastic mold compound and heatsink 2.

Figures 1, 7:
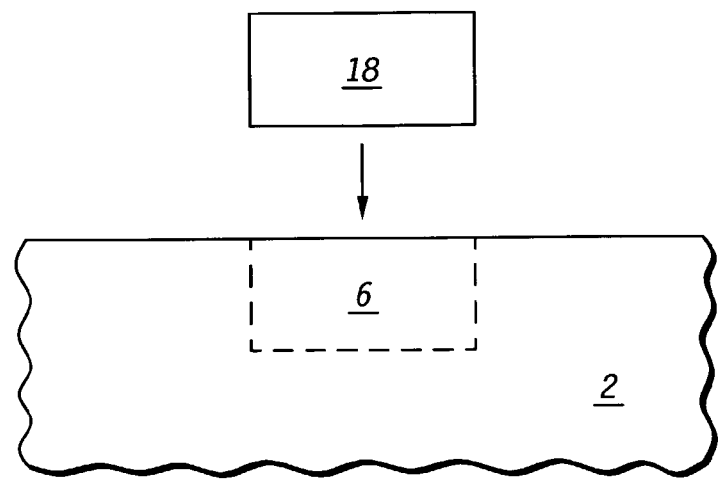
FIG. 7 illustrates a mechanical process of forming a preferred embodiment of the invention along section 3—3 of FIG. 1.
Figures 2, 7:
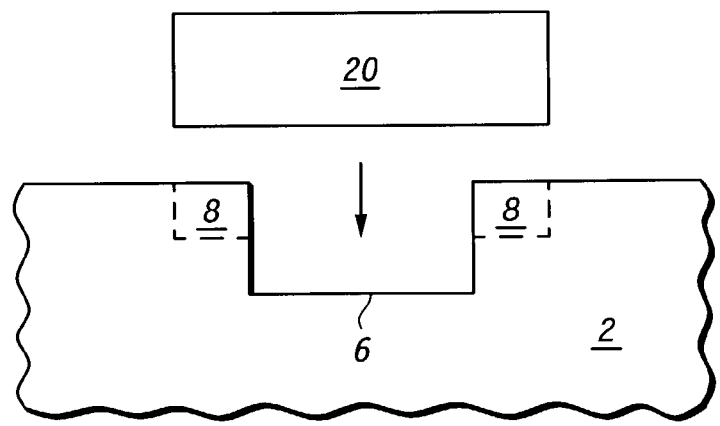
Figures 3, 7:
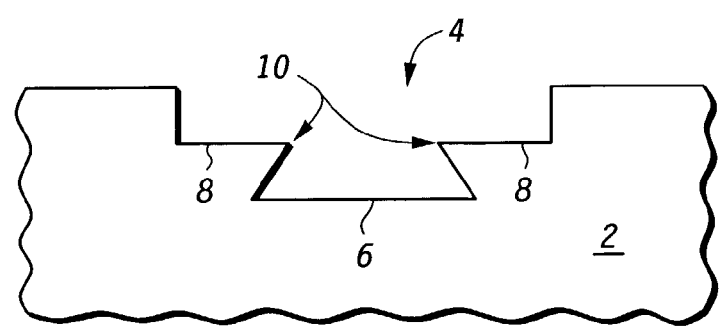

FIG. 7 illustrates a mechanical process of forming a preferred embodiment of the invention along section 3—3 of FIG. 1. FIG. 7 illustrates the two step manufacturing process that forms mold lock 4. In step 1 of FIG. 7, heatsink 2 is positioned in a conventional stamping machine under a first punch 18. First punch 18 is forced into heatsink 2 to form primary channel 6, illustrated by dashed lines. In step 2 of FIG. 7, heatsink 2 is placed under a second punch 20 that is wider than first punch 18. Second punch 20 forms secondary channels 8, illustrated in the dashed lines. In step 2 of FIG. 7, primary channel 6 is formed. In step 3 of FIG. 7, both primary channel 6 and secondary channel 8 are formed. Dovetail profiles 10 are formed from the fabrication of secondary channel 8 illustrated in step 2 of FIG. 7. Dovetail profiles 10 are formed from the displacement of heatsink 2 material shown in dashed lines in step 2 of FIG. 7. Through punching secondary channel 8 into heatsink 2, heatsink 2 material is displaced into primary channel 6 to form dovetail profiles 10.

Figures 1, 8:
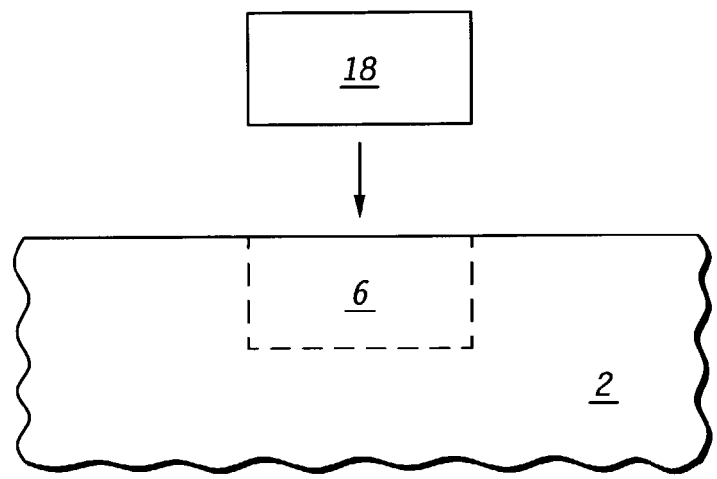
FIG. 8 illustrates a mechanical process of forming an alternative embodiment of the invention along section 6—6 of FIG. 4.
Figures 2, 8:
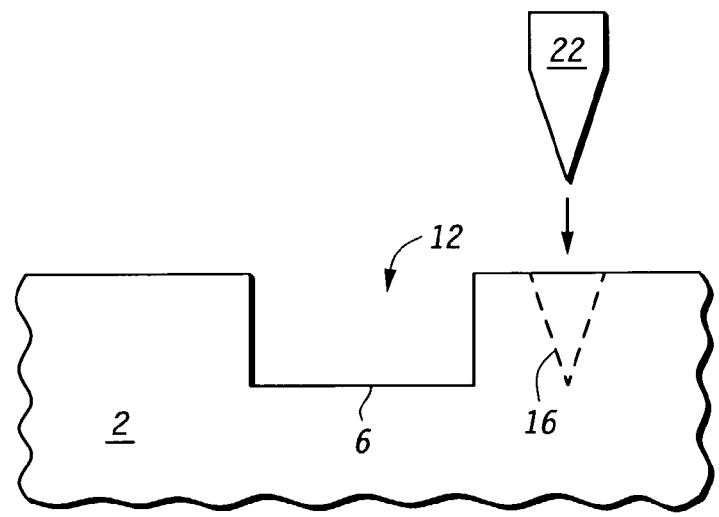
Figures 3, 8:
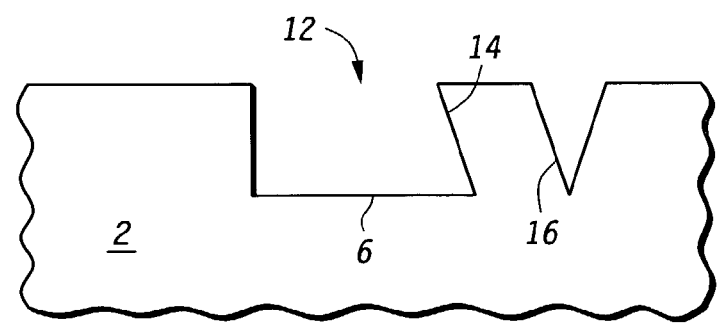

FIG. 8 illustrates a mechanical process of forming an alternative embodiment of the invention along section 6—6 of FIG. 4. FIG. 8 illustrates the two step manufacturing process that forms mold lock 12. In step 1 of FIG. 8, heatsink 2 is positioned in a conventional stamping machine under a first punch 18. First punch 18 is forced into heatsink 2 to form primary channel 6, illustrated by dashed lines. In step 2 of FIG. 8, heatsink 2 is placed under a second punch 22 that forms depression 16. Forming depression 16 with punch 22 displaces heatsink 2 material into primary channel 6 to form half dovetail profile 14 as illustrated in step 3 of FIG. 8.

Figure 9:
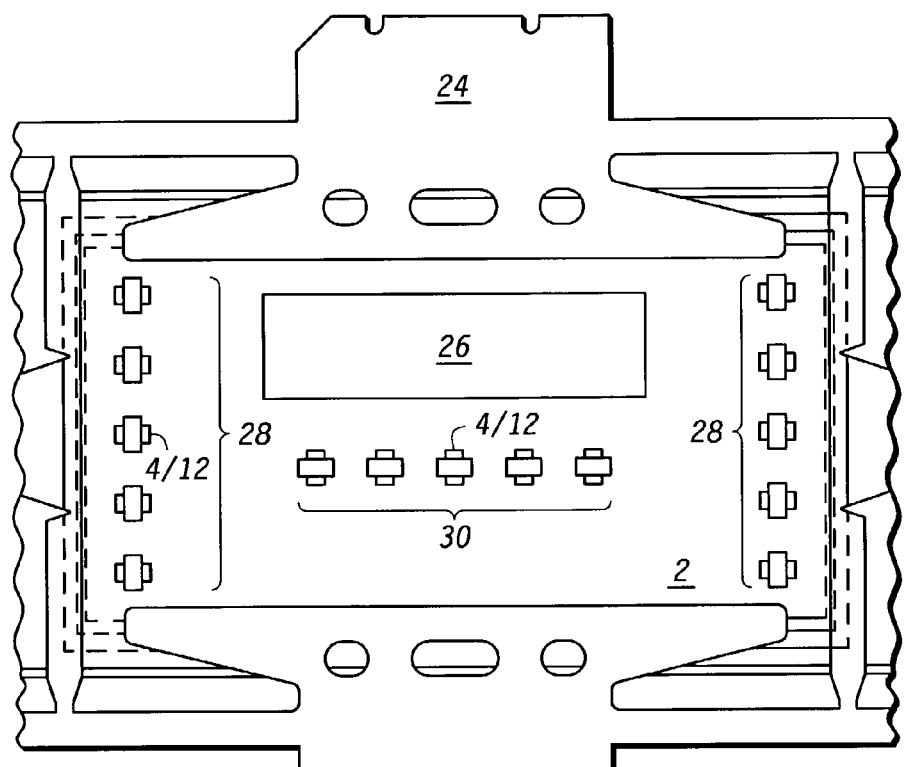
FIG. 9 illustrates a plurality of mold locks formed on a heatsink where the mold locks are coupled to a mold compound.

FIG. 9 illustrates a plurality of mold locks formed on a heatsink where the mold locks are coupled to a mold compound. A lead frame 24 made of metal is illustrated. Lead frame 24 serves two primary function. Lead frame 24 includes the electrical contacts that electrically couple a semiconductor die 26 to the outside world. In addition, lead frame 24 provides a structure that facilitates the manufacture of the microchip that includes heatsink 2, lead frame 24, and semiconductor die 26. Lead frame 24 is formed from a series of progressive metal stamping process that are performed on a flat sheet of metal. Some lead frames 24 are made with a sufficient thickness such that lead frame 24 also forms heatsink 2. Alternatively, for thin lead frames 24, a copper heatsink 2 may be attached to lead frame 24. Heatsink 2 is illustrated as having a plurality of mold locks 4 formed therein. Alternatively, half-dovetail profiles mold locks 12 could be formed in heatsink 2. Mold locks 4 are positioned to form three rows, 28 and 30. Rows 28 lie on the exterior region of heatsink 2. Row 30 lies in the interior portion of heatsink 2. This interior portion of heatsink 2 is commonly referred to as the flag because this is an area of the heatsink on which a die may be attached. Illustrated next to row 30 is semiconductor die 26. Die 26 is a small die for this size of heatsink 2. Rows 28 of mold locks 4 lock the exterior region of heatsink 2 to the plastic mold compound that molded over the top of heatsink 2. Row 30 serves the function of locking the plastic mold compound to the heatsink 2 in the interior region of heatsink 2. In this figure, semiconductor die 26 does not cover any of mold locks 4. As a result, all mold locks 4 couple with the plastic mold compound that forms the protective package.

Referring again to FIG. 9, note that each mold lock 4 in rows 28 and 30 is formed individually at a distance from the other mold locks 4. As a result, there is a region of heatsink 2 material that lies between each mold lock 4.

Figure 10:
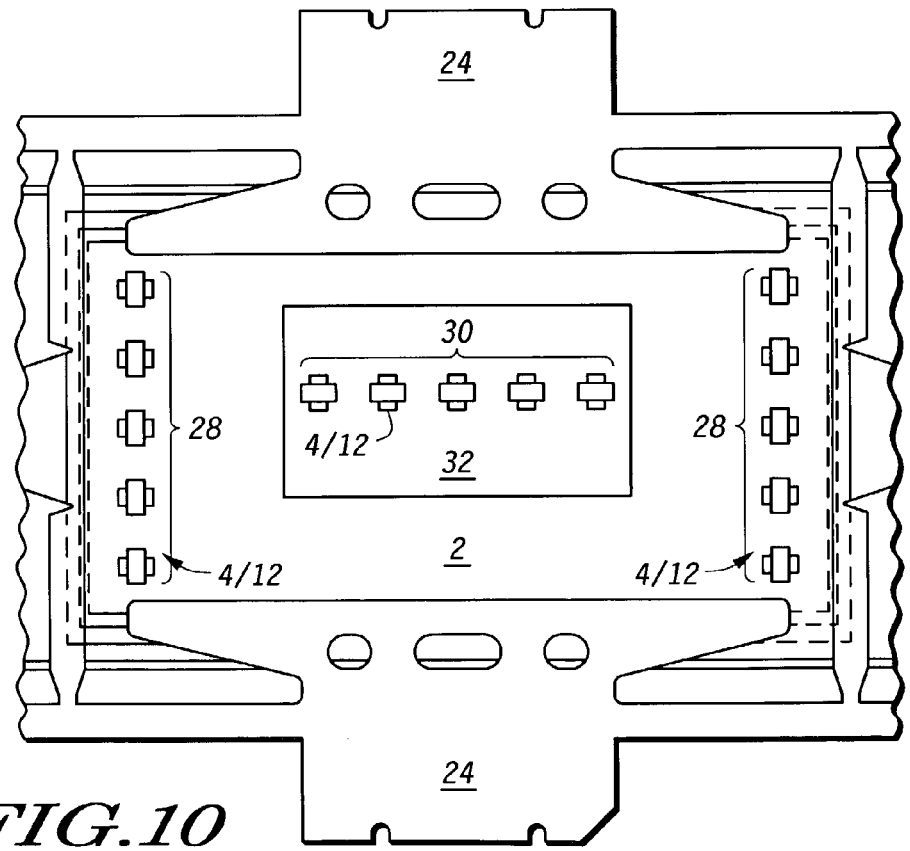
FIG. 10 illustrates a plurality of mold locks formed on a heatsink where some mold locks are coupled to a solder used to bond a semiconductor die to the heatsink.

FIG. 10 illustrates a plurality of mold locks formed on a heatsink where some mold locks are coupled to a solder used to bond a semiconductor die to the heatsink. Again, heatsink 2 is illustrated as attached to lead frame 24. Heatsink 2 is illustrated as having a plurality of mold locks 4 formed therein. Alternatively, half-dovetail profiles mold locks 12 could be formed in heatsink 2. Mold locks 4 are positioned to form three rows, 28 and 30. Rows 28 lie on the exterior region of heatsink 2. Row 30 lies in the interior portion of heatsink 2. Again, this interior portion of heatsink 2 is commonly referred to as the flag.

In FIG. 10, a large semiconductor die 32 is attached to heatsink 2. With large semiconductor die 32, a larger area of heatsink 2 is covered by die 32. As illustrated in FIG. 10, die 32 covers row 30 of mold locks 4. As a result, mold locks 4 in row 30 do not couple with the plastic mold compound. Instead, mold locks 4 in row 30 couple with the soldering compound that is used to secure die 32 to heatsink 2. In both FIGS. 9 and 10, semiconductor dies 26 and 32 are secured to heatsink 2 with a soldering compound.

Through forming mold locks 4 individually at a distance from each other, mold locks 4 do not form a channel under die 32 that would drain solder out from under die 32 onto the surface of heatsink 2. Further, due to the small size and cross section of mold locks 4, it is possible to attach semiconductor die 32 without degrading the bond between semiconductor die 32, heatsink 2, and the solder connecting the two.

Forming individual mold locks 4 into rows enables mold locks 4 to serve the function of anchoring the plastic mold compound to heatsink 2. Despite their small size, using mold locks 4 in mulitiples provides a desired mechanical lock between the plastic mold compound and heatsink 2.

Through the use of these miniature mold locks 4 or 12, it is possible to locate mold locks 4 or 12 at any position on heatsink 2 without adversely affecting the bond between die 32 and heatsink 2. As a result, it is possible to manufacture a generic "one size fits all" heatsink 2 and lead frame 24 that can be used with a small die 26 or large die 32 while preserving the overall package integrity and preventing delamination. A plurality of mold locks 4 or 12 are formed on the surface of heatsink 2. While mold locks 4 are shown formed in rows 28 and 30, this row configuration is merely exemplary. Other configurations of mold locks are possible such as a grid pattern or a checker pattern.

When a small semiconductor die such as die 26 is used, a large number, if not all of mold locks 4 are exposed to anchor the plastic mold compound to heatsink 2. In this manner, mold locks 4 function to prevent delamination. When a larger semiconductor die such as 32 is used, the die will cover many of mold locks 4. However, due to the fact that mold locks 4 have such a small geometry and are formed individually, it is possible to reliably attach large die 32 with solder over mold locks 4 without degrading the anchoring of die 32 to heatsink 2 or the anchoring of the plastic mold compound to heatsink 2. As a result, it is possible to design and manufacture a generic "one size fits all" heatsink and lead frame that is useable with varying sizes of semiconductor dies without exposing the overall package to delamination problems.

Figure 11:
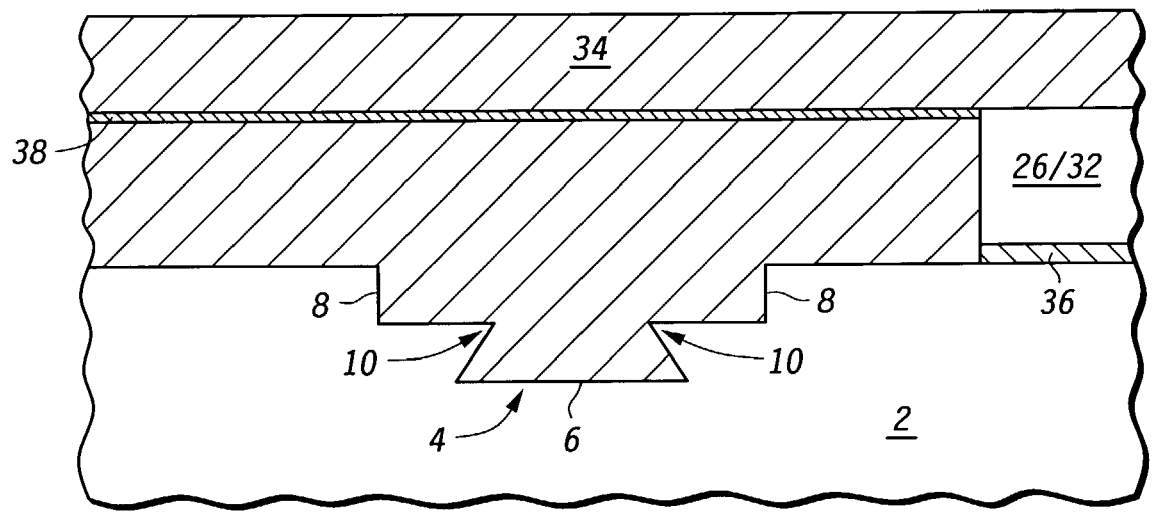
FIG. 11 illustrates a sectional view of a packaged semiconductor where a mold lock is coupled to a mold compound.

FIG. 11 illustrates a sectional view of a packaged semiconductor where a mold lock is coupled to a mold compound. The sectional view in FIG. 11 corresponds to rows 28 and 30 in FIG. 9 and row 28 in FIG. 10. Referring again to FIG. 11, the sectional view illustrates heatsink 2 having a mold lock 4 formed therein. Mold lock 4 includes a primary channel 6 and a secondary channel 8. Through forming secondary channel 8, dovetail profiles 10 are created that protrude into primary channel 8. Plastic mold compound 34 is formed on the top surface of heatsink 2. Plastic mold compound 34 is made of a thermoset plastic that has a composition such that it chemically bonds to the oxidized copper surface of heatsink 2. Plastic mold compound 24 forms the protective cover for the overall packaged semiconductor.

FIG. 11 also illustrates sectional view of semiconductor die 26/32. Die 26/32 is anchored to heatsink 2 with a solder 36. A conventional die attach solder is commonly used for solder 36. Wires 38 extend from die 26/32 to electrically couple die 26/32 to lead frame 24 in order to make the overall semiconductor package operational. Plastic mold compound 34 functions to protect wires 38 from damage and to protect the die.

During normal operation, the microchip, which includes heatsink 2, die 26/32, and mold lock 4, will go through cycles of heating and cooling. These heating and cooling cycles cause the microchip to expand and contract. Correspondingly, these heating and cooling cycles causes the plastic mold compound 34, heatsink 2, semicondcutor die 26/32, lead frame 24, and solder 36 to expand and contract. Since the microchip is made from dissimilar materials, the expansion and contraction rates are not uniform across the microchip. The different materials forming the microchip expand and contract at different rates. These differing rates of expansion and contraction of the plastic mold compound 34, heatsink 2, semicondcutor die 26/32, lead frame 24, and solder 36 that form the microchip can lead to high internal stresses that can result in device failure. Primarily, plastic mold compound 34 expands at a sufficiently different rate such that it can separate from metal heatsink 2 and metal lead frame 24. This separation is referred to as delamination. When plastic mold compound 34 delaminates from heatsink 2 and lead frame 24, significant stresses are placed on the metal wires 38 that couple lead frame 24 to semiconductor die 26/32. These stresses can become high enough such that it breaks the electrical contact between wires 38 coupling lead frame 24 to semiconductor die 26/32. Delamination can result in the failure of the microchip. It therefore becomes highly desirable to develop methods to preserve the integrity of the microchip and prevent delimination.

A further problem posed by delamination is exposure of wires 38 and semiconductor die 26/32 to moisture. Moisture can lead to corrosion in semiconductor die 26/32 causing device failure. If the delamination of the microchip opens up a path from the outside world to the interior of the microchip where semiconductor die 26/32 lies, moisture can destroy semiconductor die 26/32.

Mold lock 4 functions to anchor plastic mold compound 34 to heatsink 2 and prevent/mitigate delamination. Referring again to FIG. 11, plastic mold compound 34 is in a liquid state when it initially contacts heatsink 2. The liquified plastic mold compound 34 flows into the crevaces formed by dovetail profiles 10 in primary channel 6. Plastic mold compound 34 hardens into a solid state and consequently becomes anchored in place by mold lock 4. As is visible in FIG. 11, plastic mold compound 34 is mechanically held in position by dovetail profiles 10. As a result, mold lock 4 anchors plastic mold compound 34 to heatsink 2. Consequently, mold lock 4 functions to prevent plastic mold compound 34 from delaminating from heatsink 2 as the microchip goes through successive cycles of heating and cooling. Through preventing delamination, mold lock 4 reduces the level of internal stress on wires 38. Reducing the level on stress on wires 38 reduces the chance that wires 38 will break away from die 26/32 or lead frame 24. Consequently, the chance that the microchip will fail is reduced. As a result, mold locks 4 or 12 increase the reliability of the microchip.

Figure 12:
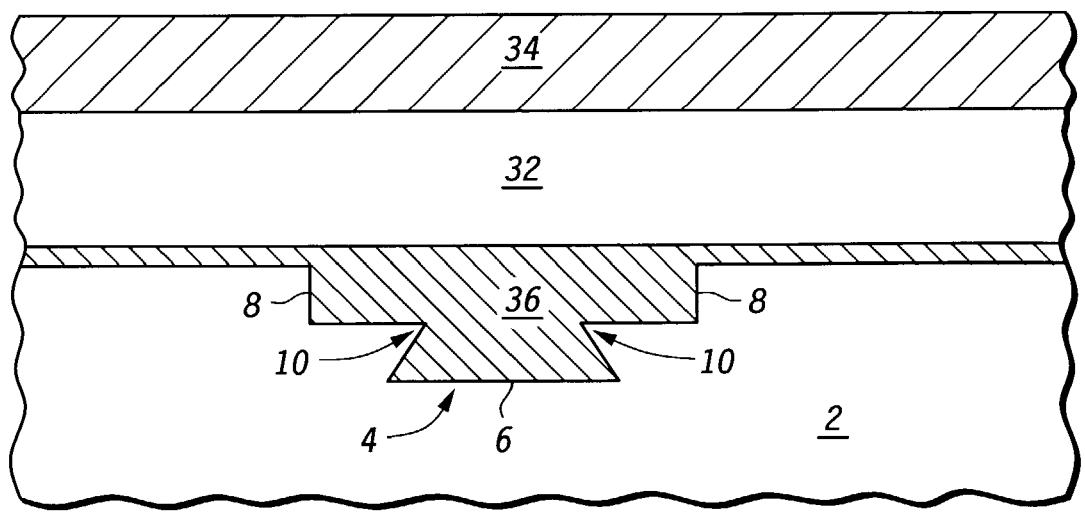
FIG. 12 illustrates a sectional view of a packaged semiconductor where a mold lock is coupled to a solder bonding a semiconductor die to a heatsink.

FIG. 12 illustrates a sectional view of a packaged semiconductor where a mold lock 4 is coupled to solder layer 36 that attaches semiconductor die 26/32 to heatsink 2. The sectional view in FIG. 12 corresponds to row 30 of mold locks 4 in FIG. 10. Semiconductor die 32 is mounted to heatsink 2 with a layer of solder 36. Solder 36, made of conventional die attach solder, when in a molten state, flows into mold lock 4. The very small geometry of mold lock 4 minimizes its impact on the integrity of the bond between heatsink 2, solder 36, and die 32. In addition, the small geometry of mold lock 4 ensures that mold lock 4 has a minimal impact on the bond line thickness of solder 36. As a result, it is possible to manufacture mold locks 4 in the area on heatsink 2 that is occupied by a large die 32 and that is not occupied by a small die 26. Consequently, mold locks 4 enable the fabrication of one heatsink 2 and lead frame 24 structure that is useable with differing die 26/32 sizes.

The small dimensions of mold locks 4 and 12 have additional benefits. Creating a mold lock 4 feature upsets material due to the stamping into the material body. Stated another way, the stamping process that forms mold locks 4 merely displaces material to another portion of heatsink 2. Unlike manufacturing processes such as milling or drilling, no material is removed from heatsink 2 in a stamping process. If mold locks 4 had a large geometry, the stamping process would displace large amounts of material. Consequently, creating several large mold lock features on heatsink 2 would make the surface of heatsink 2 uneven and non-flat. It is not possible to reliably anchor semiconductor die 26/32 to a uneven and non-flat heatsink. In order to facilitate the bonding of semiconductor die 26/32 to heatsink 2, a coining process is performed to flatten out heatsink 2 and remove the uneven and non-flat created by the stamping process. The preferred mold lock 4 has an overall depth of 0.006 inches, which is 0.0001524 meters. This very small geometry means that very little heatsink 2 material is displaced in the stamping process. As a result, a minimal coining process is required to flatten heatsink 2 after the stamping process. Consequently, it is possible to locate mold locks 4 anywhere within the flag area of heatsink 2.

While the invention has been shown and described with reference to a particular embodiment thereof, it will be understood to those skilled in the art, that various changes in form and details may be made therein without departing from the spirit and scope of the invention.

We claim:

1. A microchip structure to prevent delamination, comprising;
   a mold lock, comprising:
      a primary channel;
      a secondary channel formed above said primary channel; and
      a dovetail profile protruding into said primary channel from a wall of said primary channel;
   a row of said mold locks formed along an outer edge of a heatsink of said microchip structure; and
   a pattern of said mold locks formed within a flag area of said heatsink.

2. The microchip structure to prevent delamination of claim 1, wherein said pattern is a row.

3. The microchip structure of claim 1, wherein said primary channel has a depth of less than 0.012 inches.

4. The microchip structure of claim 1, wherein said secondary channel has a depth of less than 0.008 inches.

5. The microchip structure to prevent delamination of claim 1, wherein said mold locks formed within the flag area of said heatsink are coupled to a plastic mold compound.

6. The microchip structure to prevent delamination of claim 1, wherein said mold locks formed within the flag area of said heatsink are coupled to a soldering compound.

7. A packaged semiconductor, comprising:
   a mold lock having a primary channel and a dovetail profile protruding into said primary channel from a wall of said primary channel;
   a heatsink having a row of said mold locks formed along an outer edge of said heatsink and a pattern of said mold locks formed in an interior portion of said heatsink; and a plastic mold compound coupled to said mold locks formed along the outer edge of said heatsink.

8. The packaged semiconductor of claim 7, further comprising a secondary channel formed above said primary channel.

9. The packaged semiconductor of claim 8, wherein said primary channel has a depth of less than 0.012 inches.

10. The packaged semiconductor of claim 9, wherein said secondary channel has a depth of less than 0.008 inches.

11. The packaged semiconductor of claim 7, wherein a soldering compound is coupled to said pattern of mold locks.

12. The packaged semiconductor of claim 7, wherein said plastic mold compound is coupled to said pattern of mold locks.

13. A microchip structure to prevent delamination, comprising;
    mold lock means formed in a heatsink to anchor a compound to said heatsink,
        wherein said mold lock means comprising:
            primary channel means to receive said compound; and
            dovetail profile means to anchor said compound to said mold lock means;
    a row of said mold lock means formed along an outer edge of said heatsink; and
    a pattern of said mold lock means formed within the flag area of said heatsink.

14. The microchip structure to prevent delamination of claim 13, wherein said pattern is a row.

15. The microchip structure to prevent delamination of claim 13, wherein said primary channel means has a depth of less than 0.012 inches.

16. The microchip structure to prevent delamination of claim 13, wherein compound is a plastic.

17. The microchip structure to prevent delamination of claim 13, wherein said compound is a solder.

18. The microchip structure to prevent delamination of claim 13, wherein said mold lock means further comprises secondary channel means formed above said primary channel means to form said dovetail profile means.

19. The microchip structure to prevent delamination of claim 18, wherein said secondary channel means has a depth of less than 0.008 inches.

* * * * *